United States Patent
Glueck

(10) Patent No.: US 6,970,042 B2
(45) Date of Patent: Nov. 29, 2005

(54) POWER CONTROL FOR HIGH FREQUENCY AMPLIFIERS

(75) Inventor: Michael Glueck, Freiburg (DE)

(73) Assignee: Huettinger Elektronik GmbH & Co. KG, Freiburg (DE)

(*) Notice: Subject to any disclaimer, the term of this patent is extended or adjusted under 35 U.S.C. 154(b) by 24 days.

(21) Appl. No.: 10/695,665

(22) Filed: Oct. 29, 2003

(65) Prior Publication Data

US 2004/0113688 A1 Jun. 17, 2004

(30) Foreign Application Priority Data

Oct. 29, 2002 (DE) .......................... 102 50 229

(51) Int. Cl.⁷ ............................................. H03F 3/217
(52) U.S. Cl. .................................. 330/251; 330/207 A
(58) Field of Search ........................... 330/251, 207 A, 330/297; 363/124

(56) References Cited

U.S. PATENT DOCUMENTS

| | | | |
|---|---|---|---|
| 4,042,856 A | 8/1977 | Steigerwald | |
| 4,251,857 A | 2/1981 | Shelly | |
| 4,636,927 A | 1/1987 | Rhyne et al. | |
| 4,890,216 A | 12/1989 | Egawa | |
| 6,150,802 A | * 11/2000 | Andrews | 323/282 |
| 6,201,713 B1 | * 3/2001 | Hosotani | 363/19 |
| 6,298,222 B1 | 10/2001 | Bergveld et al. | |
| 6,411,068 B1 | * 6/2002 | Willis | 323/282 |
| 6,417,729 B1 | 7/2002 | Lemay et al. | |
| 6,600,298 B2 | * 7/2003 | McDonald et al. | 323/271 |

FOREIGN PATENT DOCUMENTS

| | | |
|---|---|---|
| DE | 353849 A1 | 5/1987 |
| DE | 3733263 A1 | 4/1988 |
| DE | 19943043 | 3/2001 |
| GB | 2260871 | 4/1993 |
| JP | 61-118220 | 6/1986 |
| JP | 61-135763 | 6/1986 |
| JP | 61-292988 | 12/1986 |
| JP | 62-274012 | 11/1987 |
| JP | 62-275593 | 11/1987 |
| JP | 62-292293 | 12/1987 |
| JP | 01-113195 | 5/1989 |
| JP | 04-68117 | 3/1992 |
| JP | 05-237685 | 9/1993 |
| JP | 05-269594 | 10/1993 |

* cited by examiner

Primary Examiner—Patricia Nguyen
(74) Attorney, Agent, or Firm—Fish & Richardson P.C.

(57) ABSTRACT

A method of controlling an input voltage of a high frequency amplifier includes measuring power supplied to a load, determining a first control variable for a series element disposed upstream from the high frequency amplifier based on the measured power and a given set point, and determining a second control variable for a switched DC supply unit from a voltage drop across the series element such that the voltage drop does not exceed a given maximum value and does not fall below a given minimum value.

26 Claims, 4 Drawing Sheets

POWER CONTROL FOR HIGH FREQUENCY AMPLIFIERS

CLAIM OF PRIORITY

This application claims priority under 35 USC § 119 to German patent application serial number DE 102.50.229.3, filed on Oct. 29, 2002, the entire contents of which is hereby incorporated by reference.

TECHNICAL FIELD

The invention relates to controlling a high frequency amplifier.

BACKGROUND

Controlling the output voltage and thus the power of most of the high frequency (HF) amplifiers operating in a switched mode (e.g., class E amplifiers) can only be realized by controlling the input voltage of the HF amplifier. This input voltage corresponds to the output voltage of a direct current (DC) supply. Thus, the DC supply is included in the control. DC current supply units, in particular DC supply units operating in the switched mode, are often too slow for controlling the input voltage of a HF amplifier for plasma processes or laser excitation due to an internal clock and filter elements being present.

From U.S. Pat. No. 4,890,216 it is known to provide a linear series element immediately upstream of the HF amplifier. U.S. Pat. No. 4,890,216 recognizes that a great power loss and a high heat development exist along with this measure. Thus, a complete voltage control is not possible with a linear series element due to the high power loss. Therefore, U.S. Pat. No. 4,890,216 proposes the use of a fast, switched series element. Such a fast switched series element is, however, more complex in its construction than a conventional DC supply unit. In addition, a switched series element shows voltage source behavior and thus a low internal resistance. Therefore, undesired resonances may be excited easily, which are not sufficiently attenuated.

SUMMARY

A method and apparatus for control a high frequency amplifier are disclosed in which the amplifier is controlled on a number of different time scales.

In a first general aspect, a method of controlling an input voltage of a high frequency amplifier includes measuring power supplied to a load, determining a first control variable for a series element disposed upstream from the high frequency amplifier based on the measured power and a given set point, and determining a second control variable for a switched DC supply unit from a voltage drop across the series element such that the voltage drop does not exceed a given maximum value and does not fall below a given minimum value.

The method can include one or more of the following features. The power supplied to the load can be determining by measuring a portion of the power supplied to the load. The power supplied to the load can be determining by measuring a portion of the power reflected from the load. The control rate for controlling the series element can be less than the control rate for controlling the DC supply unit. The control rate is less than 10 ms.

The method can further include determining a third control variable for the series element from a voltage present at a switching element of the high frequency amplifier and a set point for the maximum allowable voltage that can be present at a switching element of the high frequency amplifier. The method can further include determining a fourth control variable for the series element from a power measured at an output of the high frequency amplifier and a given power set point. The method can further include determining a fifth control variable from a current measured at an output of the series element and a given internal set point for a maximum current. The method can further include determining a fourth control variable for the series element from the power measured at an output of the high frequency amplifier and a given power set point and determining a fifth control variable from a current measured at an output of the series element and a given internal set point for a maximum current. In one embodiment, only the control variable causing a strongest control is transferred to the series element. The control rate for the first, third, fourth, and fifth control variables is faster than 10 ms, faster than 100 microseconds, or between about 10 microseconds and 1 millisecond.

The series element and an oscillator connected to the high frequency amplifier can be switched on and off synchronously. At least one control stage can be switched on and off synchronously with the series element.

In a second general aspect, a control arrangement for controlling the input voltage of a high frequency amplifier includes a series element disposed upstream from the high frequency amplifier, a first control stage for determining a first control variable from a power supplied to a load and a set point, and a switched DC current supply unit with an allocated second control stage, for determining a second control variable from a voltage drop across the series element.

The control arrangement can include one or more of the following features. The series element can include at least one semiconductor element. The semiconductor element can be a transistor. The control arrangement can further include a third control stage connected to the series element for determining a third control variable, where the third control stage is supplied with voltage present at a switching element of the HF amplifier. The control arrangement can further include a fourth control stage connected to the series element for determining a fourth control variable, where the fourth control stage is supplied with a power measured at an output of the HF amplifier. The method can further include a fifth control stage connected to the series element for determining a fifth control variable from the current measured at an output of the series element and a given maximum set point for the current. The method can further include a switch for selecting the control variable to be transferred to the series element. The method can further include a command unit connected to an oscillator for driving the HF amplifier and to the series element or to a switching element connected to the series element. The command unit can be a pulse generator. The command unit can be connected to at least one control stage.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
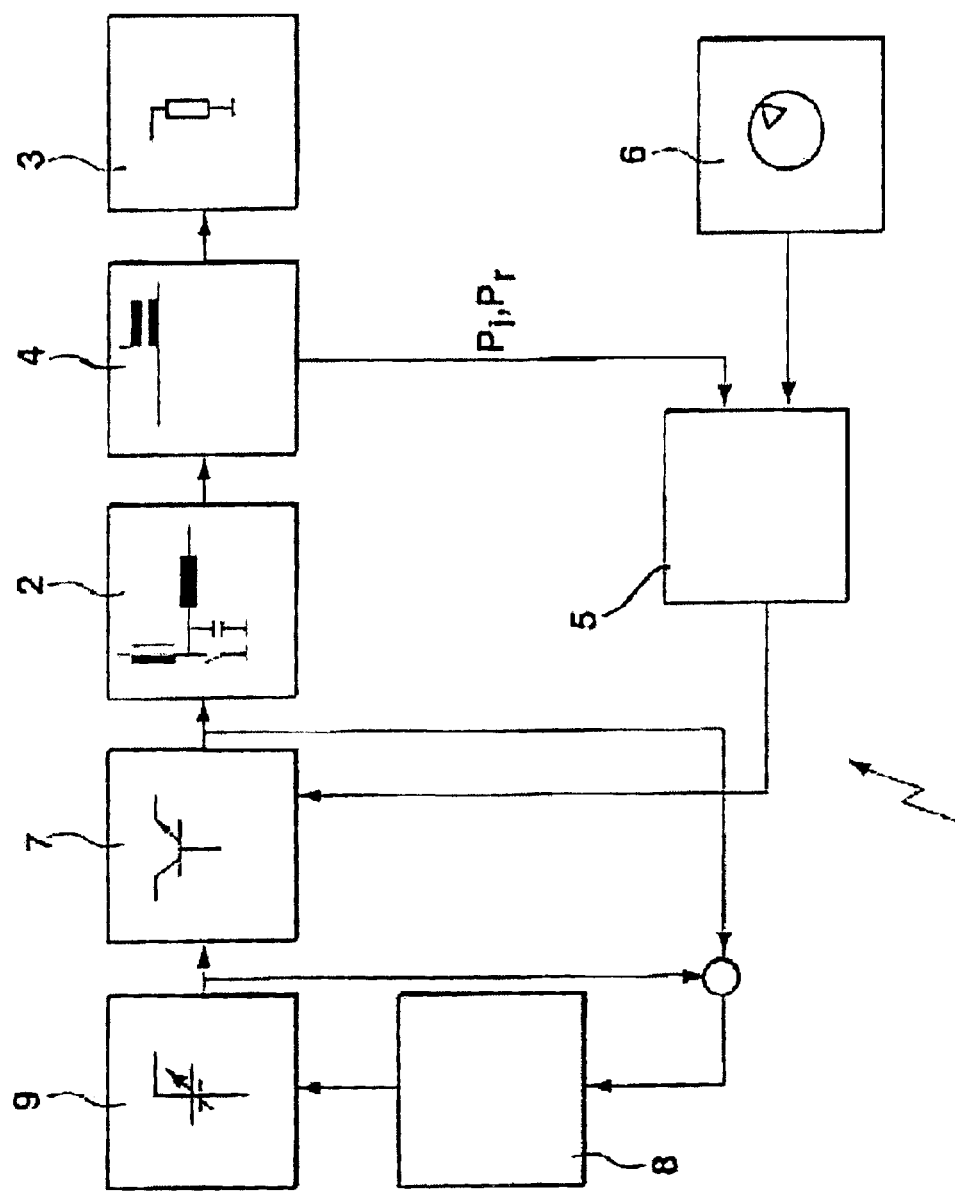
FIG. 1 is a schematic representation of a control arrangement of a high frequency amplifier with two control stages.

Referring to FIG. 1, a control arrangement 1 for controlling the voltage to a high frequency amplifier 2 is shown. The power supplied to a load 3 (the forward power, "$P_f$") and/or the power reflected by the load 3 (the reflected power, "$P_r$") is measured in a first measuring device 4 embodied in a directional coupler and is passed to a first control stage 5. Therefore, the power at the output of the control arrangement is measured in front of the load 3 and the measured power can include a portion of the power supplied to the load, reflected from the load, or parts of both supplied and reflected power. The load may be a simple load, for example, a plasma process or a laser excitation path, or a combination of an aforementioned simple load and a preceding matching network, and/or a transmission line or additional components. When power measurement is referred to, it generally includes measurement of the forward power, the reflected power, or both the forward power and reflected power.

The desired (effective) power to be supplied to the load is externally input to the first control stage 5, as is a set point 6. A first control variable is determined from the power measured at the output of the control arrangement 1 or at the output of the entire power amplifier and the set point 6, which first control variable is supplied to a series element 7. The input voltage of the HF amplifier is adjusted via the first control variable by the series element 7. The voltage drop across the series element 7 is supplied to a second control stage 8, which adjusts, by means of a second control variable, the switched DC supply unit 9 embodying a voltage source, such that the voltage drop at the series element 7 does not exceed a given maximum value and does not fall below a given minimum value. By limiting the voltage drop across the series element 7, the power loss in the series element 7 is reduced. The DC supply unit 9 and the series element 7 together form the DC supply of the HF amplifier 2. The first control stage 5 and the series element 7 operate so fast that the control rate is below 10 ms, typically between 10 $\mu$s and 1 ms. The control stage 8 operates more slowly, such that the power loss of the series element 7 and larger power variations can be adjusted over a longer period of time.

The combination of a control for the series element and a control for the DC supply unit allows for the fast control or adjustment of the power supplied to the load by the series element, and the output voltage of the series element is the input voltage of the HF amplifier. The series element is controlled by a first control stage, which determines a first control variable from the power supplied to a load and/or reflected by the load and a set point. Furthermore, a switched DC current supply unit is controlled by a second control stage, which determines a second control variable from the voltage drop across the series element.

The power measured at the output of the HF amplifier (i.e., the power delivered towards the load, the power reflected by the load, or parts of both) is the variable to be controlled (i.e., the controlled magnitude). The power supplied to the load and/or reflected by the load is typically measured indirectly by directional couplers. Hence, the forward power, the reflected power, or both are measured. The power reflected by the load is a measure of the quality of the matching. If a large reflected power occurs, the output power must be controlled such that the power amplifier is protected from destruction and less power is reflected. The power dissipated in the series element can be influenced and reduced compared with the state of the art because the voltage drop across the series element can be kept between given boundaries by controlling the DC supply unit. In addition, larger power ranges can be controlled over a larger period of time by means of the DC supply unit.

Furthermore, the HF stress of the DC supply unit can be suppressed through this technique. Oscillations are excited in the DC supply unit by pulsing (e.g., in laser applications) or by instabilities (e.g., in plasma applications). Those oscillations excite L-C filter elements (series inductivity L and parallel capacitance C) at the output terminals of the DC supply unit due to their self-resonance. The HF stress of the DC supply unit is reduced by the series element attenuating the oscillation excitation of the L-C filter elements of the DC supply unit.

The control rate for controlling the series element is generally shorter than the control rate for controlling the DC supply unit. In particular, the control rates for controlling the series element is shorter than 10 ms, typically between 10 $\mu$s and 1 ms. This allows a slow control of the power loss of the series element through the DC supply unit and a fast power control of the HF amplifier through the series element. The control rate for the DC supply unit per se is too long for using the HF amplifier for laser excitation. The interposed fast power control of the series element allows the use of the HF amplifier for laser excitation, among other applications, while at the same time minimizing the power loss in driving the HF amplifier. Thus, the required dynamic of the input voltage of the HF amplifier is achieved.

The use of a combination of a DC supply unit and a series element has the advantage that, on the one hand, the power supplied to the load or reflected by the load may be controlled quickly via the series element and, on the other hand, the voltage drop across the series element may be checked and kept within given boundaries by means of the comparatively slow control of the DC supply unit. Thus, the input voltage of the HF amplifier (e.g., a class E amplifier) can be adjusted quickly for obtaining the desired output voltage of the HF amplifier, and the power loss in the series element can be reduced. Quick control is to be understood as a control loop including a first control stage needing less than 10 ms for the control. The series element has a current source characteristic and thus avoids resonances in the DC voltage supply of the HF amplifier. The use of a series element, by which the input voltage of the HF amplifier may be quickly controlled, allows the system to level out ripple in the rectified voltage at the anode potential of a tube final stage disposed downstream from the HF amplifier. The ripple is controlled by determining a first control variable for the series element in the first control stage from the output power of the tube final stage, which corresponds to the power supplied to a load, and a set point for the power supplied to the load.

Figure 2:
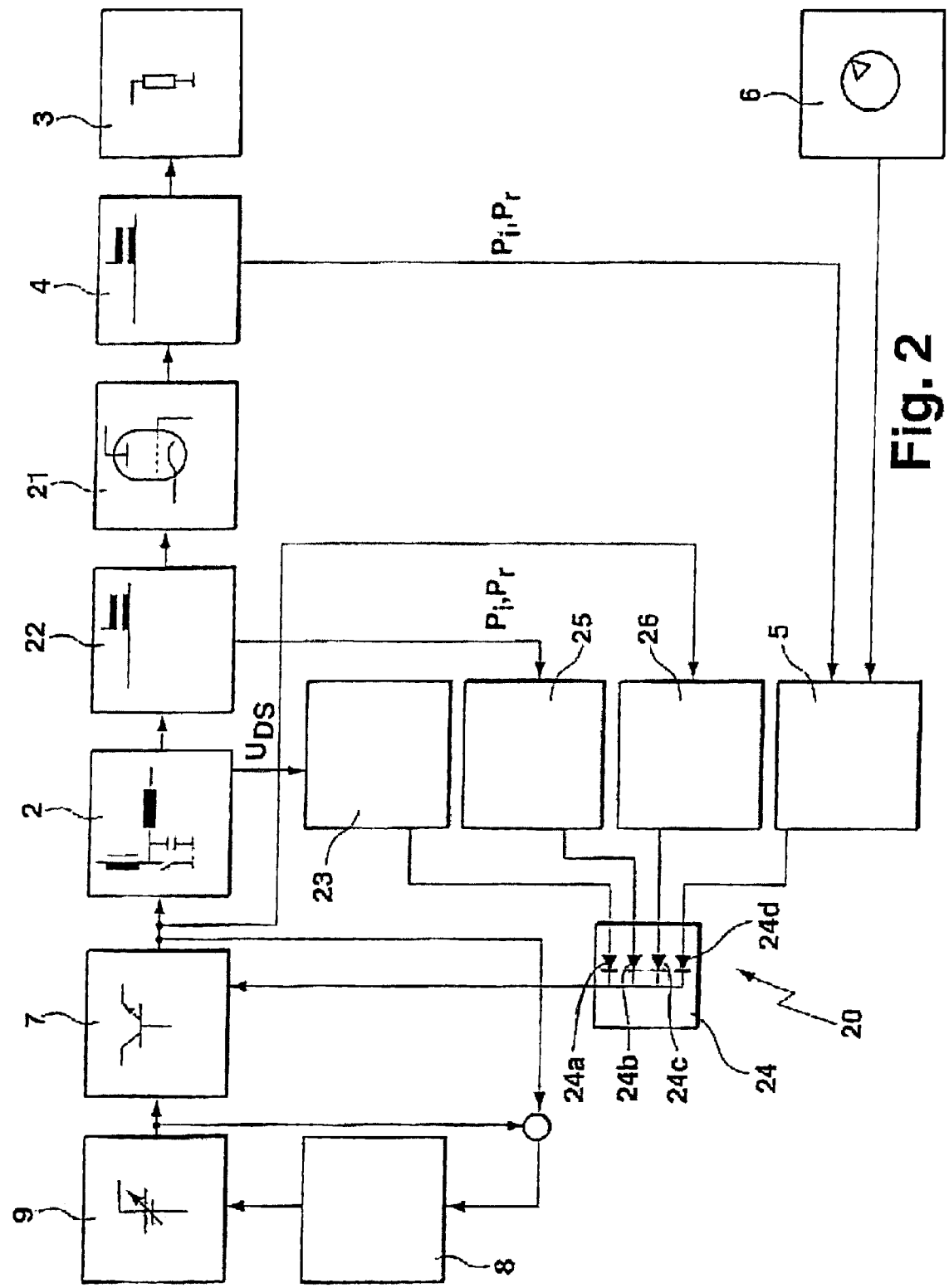
FIG. 2 is a schematic representation of a control arrangement of a high frequency amplifier with more than two control stages.

FIG. 2 shows a schematic representation of the design of an alternative control arrangement 20 of an HF amplifier 2. A final stage 21 embodied as a tube final stage is disposed downstream from an HF amplifier 2. The power supplied to the load 3 by the final stage 21 (i.e., the power measured by the measuring means 4) at the output of the control arrangement 20 in front of the load 3 is supplied to the first control stage 5, where a control variable for the series element 7 is determined from the supplied power and the given control variable 6. In this embodiment, the control stage 5 operates particularly quickly (e.g., with a response time<<10 ms). Therefore, the input voltage at the HF amplifier is controlled very quickly. Ripple at the anode of the tube may be levelled out due to the fast control and the use of the output power of the final stage 21, embodied as tube final stage, as a control variable.

The voltage $U_{DS}$ present at a switching element, embodied as a field effect transistor, of the HF amplifier 2 is supplied to a third control stage 23. In the third control stage 23, a third control variable for the series element 7 is determined from the supplied voltage UDS and an internally given set point. The first control variable of the first control stage 5 and the third control variable of the third control stage 23 are first supplied to a selection unit 24. The forward and backward power, Pi, Pr, are determined in a second measuring unit 22, embodied as a directional coupler, and are supplied to a fourth control stage 25 as a measured value. A fourth control variable is determined from the measured values and an internally given value, which fourth control variable is passed on to the selection unit 24.

The selection unit 24 is further supplied with a fifth control variable of a fifth control stage 26, in which the instantaneous current at the output of the series element 7 is compared to a given internal maximum value for the current. The fifth control variable is determined from a current measured at the output of the series element and a given internal set point for the maximum current. If the instantaneous value of the current increases over the given maximum value, the series element is controlled such that the current comes into the permitted range. The series element is protected and the power consumption in the series element is adjusted by this measure.

The selection unit 24 chooses the control variable, which control variable is passed to the series element 7. The third and fourth control stage 23, 25 provide protection for the HF amplifier 2 by ensuring that the output power of the HF amplifier and the voltage applied to the switching element do not reach inadmissible values, in particular values which could destroy the HF amplifier or succeeding devices. Advantageously, a field effect transistor may be provided as a switching element in the HF amplifier. In one embodiment, the selection is done by four diodes 24a–24d. The control rate of the first, third, fourth, and fifth control stages 5, 23, 25, 26 is significantly below 10 ms. If only the control variable (first or third or fourth or fifth control variable) causing the strongest control is transferred to the series element the series element is influenced only by the control variable performing the control having priority.

If the control rate for the first, third, fourth, and fifth control variable is<<10 ms, the series element can be controlled so fast that ripple at the anode potential of a tube final stage downstream from the HF amplifier can be levelled out, wherein the ripple may be caused by the finite smoothing of the rectified high-voltage at the anode potential. It is to be considered that the load of the HF amplifier is the input of the downstream tube final stage. At the output of the tube final stage a simple load mentioned above or a combination of loads is connected. The first control variable is thereby determined from the power measured at the output of the tube final stage.

Figure 3:
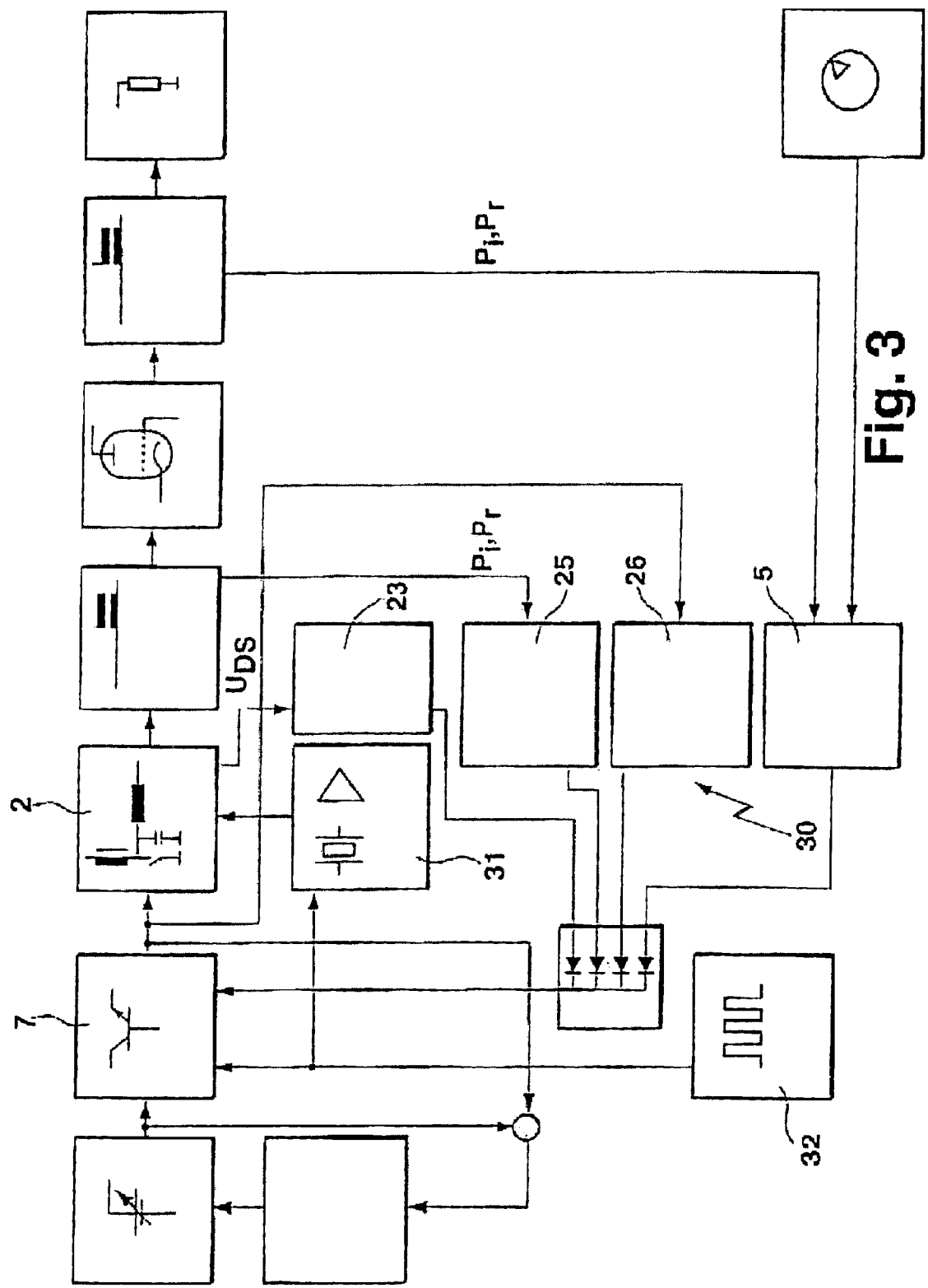
FIG. 3 is a schematic representation of a control arrangement of a high frequency amplifier with a command unit.

The control arrangement 30 in FIG. 3 corresponds largely to the arrangement in FIG. 2. Additionally, it comprises an oscillator 31 with a driver for the HF amplifier 2 and a command unit 32 embodied as pulse generator. The command unit 32 switches the series element 7 and the oscillator 31 fast and synchronously on and off, such that the control arrangement can be used for the operation of pulsed lasers with a pulse frequency of approximately 100 kHz.

Figure 4:
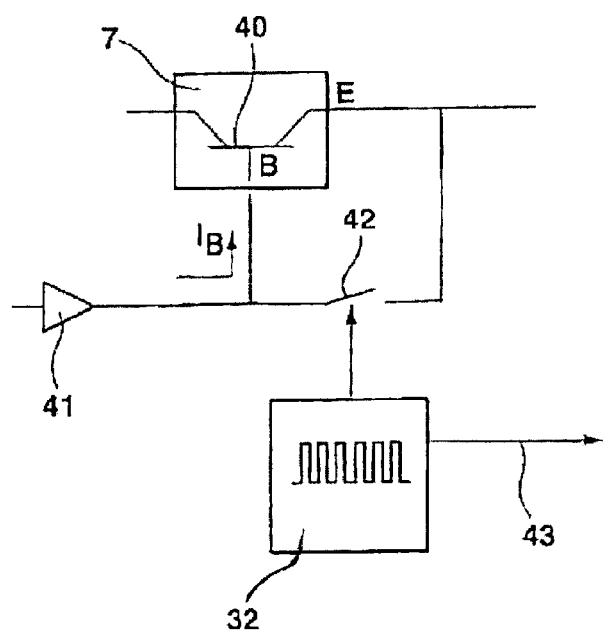
FIG. 4 is a schematic representation of a further development of the control arrangement of FIG. 3.

FIG. 4 shows a further development of the control arrangement 30 of FIG. 3. The series element 7 is realized as a bipolar transistor 40, in this case an npn bipolar transistor. The control variables from the control stages 5, 23, 25, 26 of FIG. 3 are supplied to the bipolar transistor 40 as a current $I_B$. This current $I_B$ is adjusted by an amplifier element 41. The pulsing of the series element 7 does not happen via the current $I_B$ (i.e., the switching on and off of current $I_B$), but via a switching element 42. The base B of the bipolar transistor 40 is short-circuited with the emitter E of the bipolar transistor 40 for the duration of the switching off by means of the switching element 42, in particular an electronic switch, which is connected to the command unit 32. The command unit 32 is furthermore connected to the control stages 5, 23, 25, 26 and the oscillator 31, which is indicated by arrow 43. Thus, the control stages 5, 23, 25, 26 are switched off synchronously during the switching off of the series element 7.

The series element 7 and an oscillator 31 connected to the high frequency amplifier 2 can be switched on and off synchronously. This allows interrupting the DC supply and thus a pulsed operation of a laser or a plasma used as a load and controlled starting conditions for the HF amplifier 2. The switching on and off of the DC supply unit would be too slow for a pulsed operation. This could be accommodated by switching on and off of the oscillator 31 connected to the HF amplifier 2. However, the DC supply unit would deliver current continuously and thus charge the capacitors in the HF amplifier 2. The synchronous and fast switching on and off of the series element and the oscillator 31 enables, in contrast, a high pulse frequency and controlled starting conditions for the HF amplifier 2.

In a further development, at least one control stage is switched on and off synchronously with the series element 7. Preferably, the control stage for determining the first control variable, a third control stage for determining the third control variable, a fourth control stage for determining a fourth control variable and a fifth control stage for determining a fifth control variable are switched on and off synchronously with the series element 7. Thus, it is avoided that, while the series element 7 is switched off, which results in a small power output by the HF amplifier 2, readjustment occurs. One may consider to provide further control stages, which are also switched on and off synchronously with the series element 7.

The series element 7 can include at least one semiconductor element, in particular a transistor. Thus, the series element may be realized easily and at low cost.

If a selection means is provided for selecting the control variable to be passed on to the series element, the series element is provided with the control variable (first, third, fourth, or fifth control variable) that causes the greatest control. This is to be understood such that in the control stages voltages are generated as control variables, which are amplified to positive voltages. The largest voltage obtained is then used for controlling the series element. The selection means selecting the largest voltage consists preferably of diodes, the number of which corresponds to the number of control stages connected to the selection means. One may consider providing more control stages than mentioned above, which determine control variables and supply the control variables to the selection unit. Preferably, the first, third, fourth and fifth control variable are determined in the respective control stages so fast that the series element can be controlled with a control rate<<10 ms.

A command unit (e.g., a pulse generator) can be provided, which is connected to an oscillator 31 for driving the HF amplifier 2 and to the series element 7 or to a switching element connected to the series element 7. This measure allows the use of the control arrangement for operation of a pulsed laser or plasma process (e.g., a fast ignition of the laser is enabled). This is necessary to keep the reflected power as small as possible. During ignition of the laser, the HF amplifier 2 has a transient oscillation. A certain amount of time is required until a sufficiently high voltage is present at the output of the amplifier to ignite the laser. Until then the load resistance at the HF amplifier 2 (i.e., the laser excitation path) is of high impedance. Therefore, the HF amplifier 2 is heavily mismatched. If mismatching occurs, part of the power supplied to the load is reflected back into the HF amplifier. The larger the mismatching, the more energy is reflected back. The reflected energy is converted into heat in the HF amplifier, whereby the amplifier components are stressed and the efficiency degrades. To avoid overloading, and to obtain a high efficiency, reflected power is kept low. This can be achieved by fast igniting of the laser.

Switching off of the series element may be achieved by switching on and off the current supplied to the series element as a control variable. However, because the current is typically adjusted by an amplifier element, the amplifier element would have to jump between two levels. This may lead to instabilities and to excitation of high frequency oscillations. This can be avoided by using a switching element, in particular an electronic switch, which switches the series element on and off. If a bipolar transistor is provided as the series element, this is realized by providing the switching element between the base and the emitter of the bipolar transistor.

If the command unit is connected to at least one control stage, in particular the first, third, fourth, and fifth control stage, those control stages are switched on and off synchronously with the series element. Therefore, if a low power is supplied by the HF amplifier due to the series element being switched off, no control occurs by the first, third, fourth, or fifth control stage.

OTHER EMBODIMENTS

A number of embodiments of the invention have been described. Nevertheless, it will be understood that various modifications may be made. Accordingly, other embodiments are within the scope of the following claims.

What is claimed is:

1. A method of controlling an input voltage of a high frequency amplifier, the method comprising:
   measuring power supplied to a load;
   determining a first control variable for a series element disposed upstream from the high frequency amplifier based on the measured power and a given set point; and
   determining a second control variable for a switched DC supply unit from a voltage drop across the series element such that the voltage drop does not exceed a given maximum value and does not fall below a given minimum value.

2. The method of claim 1, wherein the power supplied to the load is determined by measuring a portion of the power supplied to the load.

3. The method of claim 1, wherein the power supplied to the load is determined by measuring a portion of the power reflected from the load.

4. The method of claim 1, wherein the control rate for controlling the series element is less than the control rate for controlling the DC supply unit.

5. The method of claim 4, wherein the control rate is less than 10 ms.

6. The method of claim 1, further comprising determining a third control variable for the series element from a voltage present at a switching element of the high frequency amplifier and a set point for the maximum allowable voltage that can be present at a switching element of the high frequency amplifier.

7. The method of claim 1, further comprising determining a fourth control variable for the series element from a power measured at an output of the high frequency amplifier and a given power set point.

8. The method of claim 1, further comprising determining a fifth control variable from a current measured at an output of the series element and a given internal set point for a maximum current.

9. The method of claim 6, further comprising:
   determining a fourth control variable for the series element from the power measured at an output of the high frequency amplifier and a given power set point; and
   determining a fifth control variable from a current measured at an output of the series element and a given internal set point for a maximum current.

10. The method of claim 9, wherein only the control variable causing a strongest control is transferred to the series element.

11. The method of claim 9, wherein the control rate for the first, third, fourth, and fifth control variables is faster than 10 ms.

12. The method of claim 9, wherein the control rate for the first, third, fourth, and fifth control variables is faster than 100 microseconds.

13. The method of claim 9, wherein the control rate for the first, third, fourth, and fifth control variables is between about 10 microseconds and 1 millisecond.

14. The method of claim 1, wherein the series element and an oscillator connected to the high frequency amplifier are switched on and off synchronously.

15. The method of claim 14, wherein at least one control stage is switched on and off synchronously with the series element.

16. A control arrangement for controlling an input voltage of a high frequency amplifier, comprising:
   a series element disposed upstream from the high frequency amplifier;
   a first control stage for determining a first control variable from a power supplied to a load and a set point; and
   a switched DC current supply unit with an allocated second control stage, for determining a second control variable from a voltage drop across the series element.

17. The control arrangement of claim 16, wherein the series element comprises at least one semiconductor element.

18. The control arrangement of claim 17, wherein the semiconductor element is a transistor.

19. The control arrangement of claim 16, further comprising a third control stage connected to the series element for determining a third control variable, wherein the third control stage is supplied with voltage present at a switching element of the HF amplifier.

20. The control arrangement of claim 16, further comprising a fourth control stage connected to the series element for determining a fourth control variable, wherein the fourth control stage is supplied with a power measured at an output of the HF amplifier.

21. The control arrangement of claim 16, further comprising a fifth control stage connected to the series element for determining a fifth control variable from the current measured at an output of the series element and a given maximum set point for the current.

22. The control arrangement of claim 16, further comprising:

a third control stage connected to the series element for determining a third control variable, wherein the third control stage is supplied with a voltage present at a switching element of the HF amplifier;

a fourth control stage connected to the series element for determining a fourth control variable, wherein the fourth control stage is supplied with a power measured at the output of the HF amplifier; and a fifth control stage connected to the series element for determining a fifth control variable from a current measured at the output of the series element and a given maximum set point for the current.

23. The control arrangement of claim 22, further comprising a switch for selecting the control variable to be transferred to the series element.

24. The control arrangement of claim 16, further comprising a command unit connected to an oscillator for driving the HF amplifier and to the series element or to a switching element connected to the series element.

25. The control arrangement of claim 24, wherein the command unit is a pulse generator.

26. The control arrangement of claim 24, wherein the command unit is connected to at least one control stage.

* * * * *